United States Patent [19]

Brusic et al.

[11] Patent Number: 4,632,295

[45] Date of Patent: Dec. 30, 1986

[54] REDUCTION ATMOSPHERE WORKPIECE JOINING

[75] Inventors: Vlasta A. Brusic, Amawalk; Peter J. Elmgren, Binghamton; Charles J. Owen, Owego; David W. Sissenstein, Jr., Endwell; Helen L. Yeh, Katonah, all of N.Y.

[73] Assignee: International Business Machines Corporation, Armonk, N.Y.

[21] Appl. No.: 764,710

[22] Filed: Aug. 12, 1985

[51] Int. Cl.$^4$ ............................................. B23K 35/36
[52] U.S. Cl. ...................................... 228/123; 228/220
[58] Field of Search ................ 228/56.3, 123, 180.2, 228/219, 220, 232, 122

[56] References Cited

U.S. PATENT DOCUMENTS

| | | | |
|---|---|---|---|
| 3,203,084 | 8/1965 | Best | 29/473.1 |
| 3,340,602 | 9/1967 | Hontz | 29/588 |
| 3,468,016 | 9/1969 | Issoire | 228/219 |
| 3,531,853 | 10/1970 | Klomp | 29/427.9 |
| 3,665,590 | 5/1972 | Percival | 29/494 |
| 3,730,782 | 5/1973 | Poliak et al. | 148/23 |
| 3,869,787 | 3/1975 | Umbaugh | 29/577 |
| 3,882,596 | 5/1975 | Kendziora et al. | 228/232 |
| 3,899,074 | 8/1975 | Lucas | 228/56.3 |
| 3,900,151 | 8/1975 | Schoer et al. | 228/220 |
| 3,941,299 | 3/1976 | Godfrey | 228/219 |
| 3,966,110 | 6/1976 | Boynton | 228/175 |
| 4,000,016 | 12/1976 | Lazzarini et al. | 148/23 |
| 4,081,121 | 3/1978 | Picard | 228/181 |
| 4,127,692 | 11/1978 | Boynton | 428/137 |
| 4,143,005 | 3/1979 | Packer | 260/17 R |
| 4,215,025 | 7/1980 | Packer et al. | 260/29.2 R |
| 4,223,826 | 9/1980 | Usui | 228/219 |
| 4,269,870 | 5/1981 | Boynton | 427/96 |
| 4,371,912 | 2/1983 | Guzik | 228/180.2 |
| 4,496,098 | 1/1985 | Kawakatsu | 228/220 |
| 4,504,007 | 3/1985 | Anderson et al. | 228/220 |

FOREIGN PATENT DOCUMENTS 27193 8/1973 Japan ..................................... 228/220

OTHER PUBLICATIONS

The Merck Index, 10th Edition, by Martha Windholz, 1983.

*Primary Examiner*—M. Jordan
*Attorney, Agent, or Firm*—Pollock, Vande Sande & Priddy

[57] ABSTRACT

A workpiece is joined to a substrate by employing solder and applying diol and/or polyol and/or ether derivative thereof to the substrate. The workpiece is placed in contact with the diol and/or polyol and the resulting assembly is heated in a reducing atmosphere.

23 Claims, No Drawings

REDUCTION ATMOSPHERE WORKPIECE JOINING

TECHNICAL FIELD

The present invention is concerned with joining a workpiece to a substrate and is particularly concerned with joining an integrated circuit chip to a substrate. The present invention is especially concerned with soldering in a reducing atmosphere.

BACKGROUND ART

During the preparation of integrated circuit modules, input/output (I/O) pins are inserted into the substrate so as to protrude from one surface of the substrate known as the bottom side, for insertion into circuit cards or circuit boards. The pins also protrude slightly from the other surface referred to as the top side so as to contact the circuitry on the top side which, in turn, connects to the integrated circuit chip or chips which are subsequently connected to the substrate or carrier. When the pins are to be connected to the substrate circuitry by a soldering process, solder flux compositions have been applied to the pins.

Solder flux compositions are employed to remove oxides from the pins and to prevent the pins from oxidizing when subjected to elevated temperature for soldering and thereby serving to maintain the electrical conductivity of the pins.

Once the solder is applied, any flux composition or residue therefrom, (e.g., unpolymerized species) remaining on the pins and substrate must be removed to provide as clean a substrate as possible. This involves a cleaning step which normally employs an organic composition such as N-methyl pyrollidone or a halogenated hydrocarbon such as perchloroethylene in the case of rosin-base flux compositions.

In addition, integrated circuit chips are attached to the integrated substrate or carrier by applying solder to preselected areas on the substrate which is generally referred to in the art as the "chip pad area". Such areas can be defined, for instance, by providing preselected exposed areas of a metal such as copper which will accept the solder. Moreover, a flux composition would normally be applied to the substrate to facilitate the application of the solder to the chip pad area. After solder is applied to the chip pad area, any flux and/or flux residue must be removed prior to attaching the integrated circuit chip so as to provide as clean a module as possible.

SUMMARY OF INVENTION

The present invention makes it possible to eliminate the liquid flux compositions previously required and, in turn, the cleaning steps to remove the flux and/or flux residue. This, in turn, eliminates the precautions necessary for pollution abatement.

Another aspect of the present invention is that the only by-products produced are water small amounts of carbon dioxide and some hydrocarbon gases.

The process of the present invention is concerned with a process for joining a workpiece to a substrate. According to preferred aspects, the present invention is concerned with a process that provides, through soldering, an electrical connection between both the pins and the substrate circuitry, and the substrate circuitry and the workpiece. The process includes applying solder to the area where the pin and the substrate circuitry are to be subsequently joined together. In other words, the solder is applied to the area of the substrate where the workpiece is to be subsequently joined and/or to the workpiece. A dihydric or polyhydric alcohol or ether derivative is applied in the area of the substrate where the workpiece is to be subsequently joined. This area may or may not be devoid of solder. A workpiece, which can contain solder, is then placed over this area and in contact with at least a portion of the dihydric and/or polyhydric alcohol and/or ether derivative thereof on the substrate. The resulting assembly is heated in a reducing atmosphere to thereby join the workpiece to the substrate.

The entire joining or soldering process, with the exception of the dihydric and/or polyhydric alcohol and/or ether derivative thereof, is a dry process. Dry processes are desirable since such include fewer process steps, less contamination, and better dimensional control when compared to the wet processes employed.

BEST AND VARIOUS MODES FOR CARRYING OUT INVENTION

The substrates to which the workpiece is joined are preferably those substrates commonly used in the preparation of integrated circuit modules or carriers such as ceramic substrates. A ceramic is a product or material manufactured by the action of heat on earthy raw materials. Preferred ceramic substrates include aluminum oxides, silicon oxides, and silicates such as aluminum silicate. The substrate preferably includes preformed holes through which input/output pins are inserted so as to protrude from one surface of the substrate, known as the bottom side for insertion into the circuit cards or circuit boards. The pins also protrude slightly from the other surface, referred to as the top side, so as to contact the circuitry on the top side which, in turn, connects to the integrated circuit chip or chips mounted on the back side of the substrate. The pins of the module can be any of the input/output pins well-known in the art and need not be discussed here in any great detail. Examples of suitable pins are gold-plated pins, copper-plated pins, solid copper pins, nickel alloys, copper alloys, and tin-plated pins.

If desired, after the pinning operation, the assembly can be cleaned to remove oils and fingerprints by immersion in an aqueous detergent composition. According to preferred aspects of the present invention, any oxides formed on the pins and substrate can be removed by subjecting the assembly to elevated temperatures in a reducing atmosphere such as in a hydrogen atmosphere containing less than 10 ppm of oxygen, and preferably less than 1 ppm of oxygen, and most preferably no oxygen. It is also preferred that the atmosphere in the furnace contain less than 50 ppm of water and most preferably, no water. The temperature in the hydrogen atmosphere is usually about 300° C. to about 500° C. and preferably about 350° C. to about 450° C. The cleaning can be carried out in a furnace either batch-wise or continuously employing a conveyor belt. A suitable conveyor belt type of container exhibiting the desired hydrogen atmosphere is the platinum catalytic container disclosed in U.S. patent application Ser. No. 665,404 to MacInnes, et al., filed on Oct. 25, 1984, disclosure of which is incorporated herein by reference. In addition, an automatic batch-type furnace which is suitable is disclosed in U.S. patent application Ser. No.

563,434 to MacInnes, et al., filed on Dec. 20, 1983, disclosure of which is incorporated herein by reference.

The flow rate of the gas in the furnace is usually about 30 to about 50 standard cubic feet per hour and preferably about 38 to about 42 standard cubic feet per hour; an example of which is about 40 standard cubic feet per hour.

The assembly is exposed to the reducing atmosphere for at least about 1 to about 3 minutes at temperatures of at least about 350° C. and preferably about 2 to about 2.5 minutes at temperatures of at least about 350° C. In a conveyor type of furnace of about 216 inches long, the conveyor speed is about 5-15 inches per minute and preferably about 11 inches per minute.

Solder is applied to the pin heads which are slightly protruding from the top side of the substrate. One convenient form of applying the solder is in the form of rings having dimensions suitable for placing around the diameter of the pin heads. Solder can, but does not have to be applied to the area of the substrate in which the chip or chips are to be subsequently joined. Instead of or in addition to the solder on the substrate where the chip(s) are to be joined, the solder can be applied to the surface of the chip(s) which are to confront the substrate.

Examples of suitable solders are tin-lead solders. Preferred tin-lead solders contain about 3% to about 63% by weight of tin and, correspondingly, about 97% to about 37% by weight of lead. For a discussion of the configuration in which the pins and chips are joined to a substrate, see U.S. Pat. No. 3,229,240 to McNutt, et al. and U.S. Pat. No. 4,233,620 to Darrow, et al., disclosures of which are incorporated herein by reference. Typical examples of such tin-lead solders are 3% tin-97% lead; 5% tin-95% lead; 10% tin-90% lead; 63% tin-37% lead; and 60% tin-40% lead.

Next, a thin layer of a dihydric alcohol and/or polyhydric alcohol and/or ether derivative thereof is applied to the substrate on at least a portion of that area where the chip or chips or workpiece are to be joined to the substrate.

The alcohols and ether derivatives employed are generally saturated aliphatic alcohols or ether thereof having 2 to 6 hydroxyl groups and containing up to about 20 carbon atoms and preferably 10 carbons or less. In addition, it is preferred that the alcohols and ether derivatives vaporize and/or decompose at temperatures of less than about 350° C. and preferably less than about 300° C.

Examples of dihydric alcohols, polyhydric alcohols, and ether derivatives are 1,2-ethanediol; 1,2-propanediol; 1,3-propanediol; 1,3-butanediol; 1,4-butanediol; 1,5-pentanediol; 2,5-hexanediol; 1,6-hexanediol, glycerol; pentaerythritol; diethylene glycol; triethylene glycol; tetraethylene glycol; dipropylene glycol; and polyethylene glycols and polypropylene glycols having molecular weights of about 200-6,000. Mixtures of alcohols and/or mixtures of ether derivatives thereof can be used when desired. The preferred alcohols are the propylene glycols with 1,2-propanediol being the most preferred. In general, the preferred alcohols and/or ethers employed exhibit viscosities at room temperature of at least about 50 centipoises. Moreover, it is preferred that the alcohols and/or ethers, when employed in the present invention, are not combined with any compounds having atoms other than carbon, oxygen, and/or hydrogen and are not combined with materials which would leave solid residue on the substrate after the soldering step, and most preferably not combined with any other materials.

The alcohol and/or ether derivatives thereof function as fugitive adhesives in holding the chip(s) in place on the substrate during the soldering processing.

The amount of alcohol and/or ether derivative applied need only be a very thin layer and, accordingly, such can be applied with an eye dropper. In fact, less than one drop of such is sufficient for the purposes of the present invehtion. Of course, greater amounts can be employed without adversely affecting the process of the present invention.

The circuit chip or chips are then applied to the substrate in contact with the alcohol and/or ether derivative thereof. The alcohol and/or ether derivative thereof holds the chip(s) in place in a manner similar to the function of normal flux compositions containing rosin or abietic acid. However, unlike normal flux compositions, the alcohol and/or ether derivative does not provide the chemical fluxing action. This, in accordance with the present invention, is provided by gas in the reducing atmosphere.

The assembly is then heated in a reducing atmosphere in order to join the chip to the substrate and to simultaneously cause tinning of the pin heads. This step assures an electrical connection between the pins and the circuitry. The conditions of the reducing atmosphere are the same as those discussed hereinabove for the step of removing oxide from the pins and substrate. The oxygen content of the reducing atmosphere is less than 10 ppm, preferably less than 1 ppm, and most preferably entirely free from oxygen. The temperature employed is about 300° C. to about 500° C. and preferably about 350° C. to about 450° C. The dwell time of exposure of the assembly to these conditions is about 1 to about 5 minutes. In a conveyor type furnace of about 216 inches long, the conveyor speed is about 5-15 inches per minute and preferably about 11 inches per minute.

The heating in the reducing atmosphere results in tinning and soldering of the chips and also results in the conversion of the alcohol and/or ether derivative thereof to water, $CO_2$, and some saturated hydrocarbon gases including propane and smaller amounts of ethane and methane.

Next, the assembly is then processed according to conventional methods to form the final module.

As can be appreciated, the process of the present invention can be considered a fluxless process for soldering whereby the only by-products are gases and certain hydrocarbons which can be readily removed by burning off with excess hydrogen. Since no residue is left on the assembly after the soldering, the normal cleaning operations involving organic solvents is eliminated.

Also, the present invention makes it possible to both join the chips to the substrate and to solder the heads of the pins simultaneously in a hydrogen atmosphere. Of course, if desired, the steps can be done separately.

It has been observed that solder joints of the chips to the substrate have reduced occurrence of voids as compared to those obtained using conventional prior art flux compositions described above. Also, the expected life of the solder joints is increased as compared to using conventional prior art flux compositions.

Although the above process has been described with respect to joining chips to a substrate for convenience, it is understood that the process of the present invention is applicable to joining workpieces in general to a substrate.

Having thus described our invention, what we claim as new and desire to secure by Letters Patent is:

1. A process for joining a workpiece to a substrate which comprises:
   a. applying solder to the area of said substrate where the workpiece is to be joined, or to said workpiece, or to both;
   b. applying to at least a portion of the area of said substrate where the workpiece is to be joined, a material selected from the group of dihydric alcohols, polyhydric alcohols, ether derivatives thereof, or mixtures thereof;
   c. positioning a workpiece on said substrate in contact with at least a portion of said material;
   d. heating the resulting assembly in a reducing atmosphere; and
   e. thereby joining said workpiece to said substrate.

2. The process of claim 1 wherein said workpiece is an integrated circuit chip.

3. The process of claim 2 wherein said substrate is a ceramic substrate.

4. The process of claim 1 wherein said substrate is a ceramic substrate.

5. The process of claim 1 wherein said reducing atmosphere is a hydrogen atmosphere wherein the amount of oxygen is less than 10 ppm.

6. The process of claim 5 wherein the temperature is about 300° C. to about 500° C.

7. The process of claim 6 wherein said heating is carried out for about 1 to about 3 minutes.

8. The process of claim 6 wherein said reducing atmosphere is hydrogen containing less than 1 ppm of oxygen.

9. The process of claim 6 wherein said reducing atmosphere is 100% hydrogen.

10. The process of claim 6 wherein said temperature is about 350° C. to about 450° C.

11. The process of claim 1 wherein said material is a saturated aliphatic alcohol or ether thereof containing 2 to 6 hydroxyl groups.

12. The process of claim 11 wherein said material contains 20 carbon atoms or less.

13. The process of claim 11 wherein said material contains 10 carbon atoms or less.

14. The process of claim 1 wherein said material is a 1,3-propanediol.

15. The process of claim 1 wherein said material is 1,2-propanediol.

16. The process of claim 1 which further comprises inserting input/output pins into the substrate prior to applying the solder.

17. The process of claim 16 wherein after insertion of the pins and prior to applying the solder the assembly is subjected to heating in a reducing atmosphere in order to remove oxide.

18. The process of claim 17 wherein said reducing atmosphere is hydrogen containing less than 10 ppm of oxygen.

19. The process of claim 17 wherein said reducing atmosphere is hydrogen containing less than 1 ppm of oxygen.

20. The process of claim 18 wherein the temperature is about 300° C. to about 500° C.

21. The process of claim 18 wherein said temperature is about 350° C. to about 450° C.

22. The process of claim 20 wherein the assembly is subjected to the heating for about 1 to about 3 minutes.

23. The process of claim 11 which further includes applying solder, to the pin heads which protrude from the top side of the substrate and simultaneously joining the chip to the substrate and soldering the pin heads.

* * * * *